(12) United States Patent
Wong et al.

(10) Patent No.: US 11,784,237 B2
(45) Date of Patent: Oct. 10, 2023

(54) SEMICONDUCTOR DEVICES AND METHODS OF MANUFACTURING THE SAME

(71) Applicant: INNOSCIENCE (ZHUHAI) TECHNOLOGY CO., LTD., Zhuhai (CN)

(72) Inventors: Kingyuen Wong, Zhuhai (CN); Han-Chin Chiu, Zhuhai (CN); Ming-Hong Chang, Zhuhai (CN); Chunhua Zhou, Zhuhai (CN); Jinhan Zhang, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 267 days.

(21) Appl. No.: 17/048,619

(22) PCT Filed: Dec. 20, 2019

(86) PCT No.: PCT/CN2019/127085
§ 371 (c)(1),
(2) Date: Oct. 19, 2020

(87) PCT Pub. No.: WO2020/125764
PCT Pub. Date: Jun. 25, 2020

(65) Prior Publication Data
US 2021/0151594 A1    May 20, 2021

(30) Foreign Application Priority Data
Dec. 21, 2018  (CN) .......................... 201811571363.5

(51) Int. Cl.
*H01L 29/66*    (2006.01)
*H01L 29/20*    (2006.01)
(Continued)

(52) U.S. Cl.
CPC .... *H01L 29/66462* (2013.01); *H01L 29/1029* (2013.01); *H01L 29/2003* (2013.01); *H01L 29/7786* (2013.01); *H01L 2924/13064* (2013.01)

(58) Field of Classification Search
CPC ........... H01L 29/66462; H01L 29/1029; H01L 29/7786; H01L 29/66; H01L 29/778; H01L 29/10
See application file for complete search history.

(56) References Cited

U.S. PATENT DOCUMENTS 8,530,936 B2 *   9/2013  Ishii ................... H01L 29/66431
                                                      257/192
8,937,336 B2     1/2015  Chen et al.
(Continued)

FOREIGN PATENT DOCUMENTS

CN    101300669 A    11/2008
CN    102856163 A    1/2013
(Continued)

OTHER PUBLICATIONS

First Office Action of the corresponding China patent application No. 201811571363.5 dated Apr. 28, 2020.
(Continued)

*Primary Examiner* — Yasser A Abdelaziez
(74) *Attorney, Agent, or Firm* — McCoy Russell LLP

(57) ABSTRACT

A semiconductor device includes a substrate, a channel layer, a barrier layer, a gate, a strained layer and a passivation layer. The channel layer is disposed on the substrate. The barrier layer is disposed on the channel layer. The gate is disposed on the barrier layer. The strained layer is disposed on the barrier layer. The passivation layer covers the gate and the strained layer. The material of the passivation layer differs from that of the strained layer.

20 Claims, 19 Drawing Sheets

(51) Int. Cl.
*H01L 29/10* (2006.01)
*H01L 29/778* (2006.01)

(56) References Cited

U.S. PATENT DOCUMENTS

| | | | | |
|---|---|---|---|---|
| 8,969,881 | B2* | 3/2015 | Briere | H01L 29/66462 |
| | | | | 257/326 |
| 9,299,821 | B2 | 3/2016 | Shealy et al. | |
| 9,425,301 | B2 | 8/2016 | Chiu et al. | |
| 10,170,611 | B1 | 1/2019 | Tang et al. | |
| 10,312,176 | B2 | 6/2019 | Pei et al. | |
| 10,749,021 | B2 | 8/2020 | Huang et al. | |
| 2005/0023555 | A1 | 2/2005 | Yoshida et al. | |
| 2011/0108885 | A1* | 5/2011 | Sazawa | H01L 29/1054 |
| | | | | 257/E21.119 |
| 2012/0326165 | A1 | 12/2012 | Nakata et al. | |
| 2014/0335666 | A1* | 11/2014 | Koehler | H01L 21/02661 |
| | | | | 438/172 |
| 2015/0318387 | A1* | 11/2015 | Chiu | H01L 21/02164 |
| | | | | 438/172 |
| 2016/0049347 | A1* | 2/2016 | Negoro | H01L 23/3171 |
| | | | | 257/472 |
| 2017/0104092 | A1* | 4/2017 | Tanaka | H01L 29/7786 |
| 2017/0170089 | A1* | 6/2017 | Donkers | H01L 29/66212 |
| 2020/0161462 | A1* | 5/2020 | Iucolano | H01L 29/7838 |
| 2020/0203502 | A1* | 6/2020 | Wong | H01L 29/1029 |

FOREIGN PATENT DOCUMENTS

| | | |
|---|---|---|
| CN | 103489911 A | 1/2014 |
| CN | 104253180 A | 12/2014 |
| CN | 104412388 A | 3/2015 |
| CN | 105047707 A | 11/2015 |
| CN | 105226093 A | 1/2016 |
| CN | 108604596 A | 9/2018 |
| CN | 108695384 A | 10/2018 |
| CN | 109037323 A | 12/2018 |

OTHER PUBLICATIONS

Second Office Action of the corresponding China patent application No. 201811571363.5 dated Oct. 12, 2020.
Notice of Disallowance of the corresponding China patent application No. 201811571363.5 dated Mar. 12, 2021.
Non-Final Office Action of the corresponding U.S. Appl. No. 16/709,427 dated Jul. 6, 2021.
First Office Action of the corresponding China patent application No. 201980005610.1 dated Mar. 3, 2022.
International Search Report of corresponding PCT Patent Application No. PCT/CN2019/127085 dated Mar. 19, 2020.
State Intellectual Property Office of the People's Republic of China, Office Action and Search Report Issued in Application No. 201980005610.1, dated Apr. 25, 2023, 14 pages. (Submitted with Machine Translation).

* cited by examiner

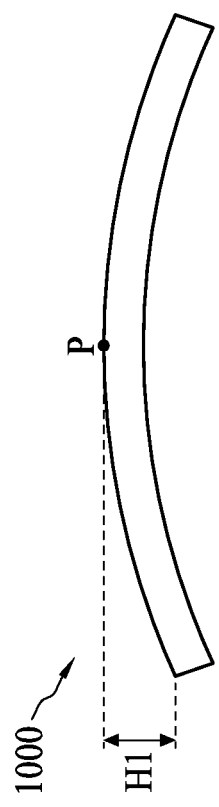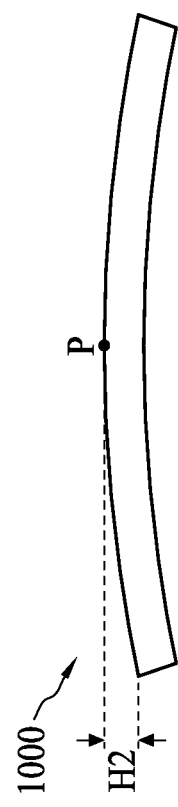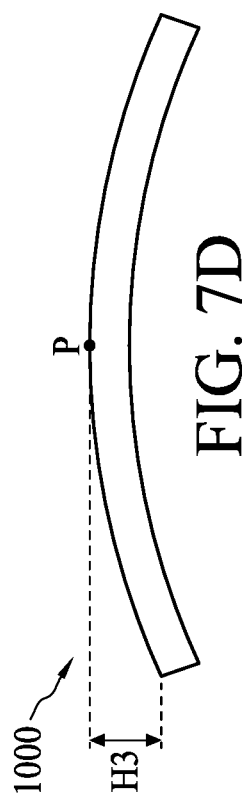

SEMICONDUCTOR DEVICES AND METHODS OF MANUFACTURING THE SAME

BACKGROUND

1. Field of the Disclosure

The present disclosure relates to a semiconductor device and more particularly to a semiconductor device with a strained layer.

2. Description of Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device includes a substrate, a channel layer, a barrier layer, a gate, a strained layer and a passivation layer. The channel layer is disposed on the substrate. The barrier layer is disposed on the channel layer. The gate is disposed on the barrier layer. The strained layer is disposed on the barrier layer. The passivation layer covers the gate and the strained layer. The material of the passivation layer differs from that of the strained layer.

According to some embodiments of the present disclosure, a semiconductor device can include a substrate, a channel layer, a barrier layer, a gate and a strained layer. The channel layer is disposed on the substrate. The barrier layer is disposed on the channel layer. The gate is disposed on the barrier layer. The strained layer is disposed on the barrier layer. The material of the strained layer includes at least one of silicon nitride, silicon oxide, silicon oxynitride, boron oxide, boron nitride, boron oxynitride, aluminum oxide, aluminum nitride, aluminum oxynitride, titanium oxide and titanium oxynitride.

According to some embodiments of the present disclosure, a method of manufacturing a semiconductor device includes: providing a substrate, forming a channel layer on the substrate; forming a barrier layer on the channel layer; forming a gate on the barrier layer; forming a strained layer on the barrier layer; forming a passivation layer covering the gate and the strained layer. The material of the passivation layer differs from that of the strained layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 7A, FIG. 7B, FIG. 7C and FIG. 7D are side views of the entire semiconductor device structure in accordance with some embodiments of the present disclosure.

Figure 1:
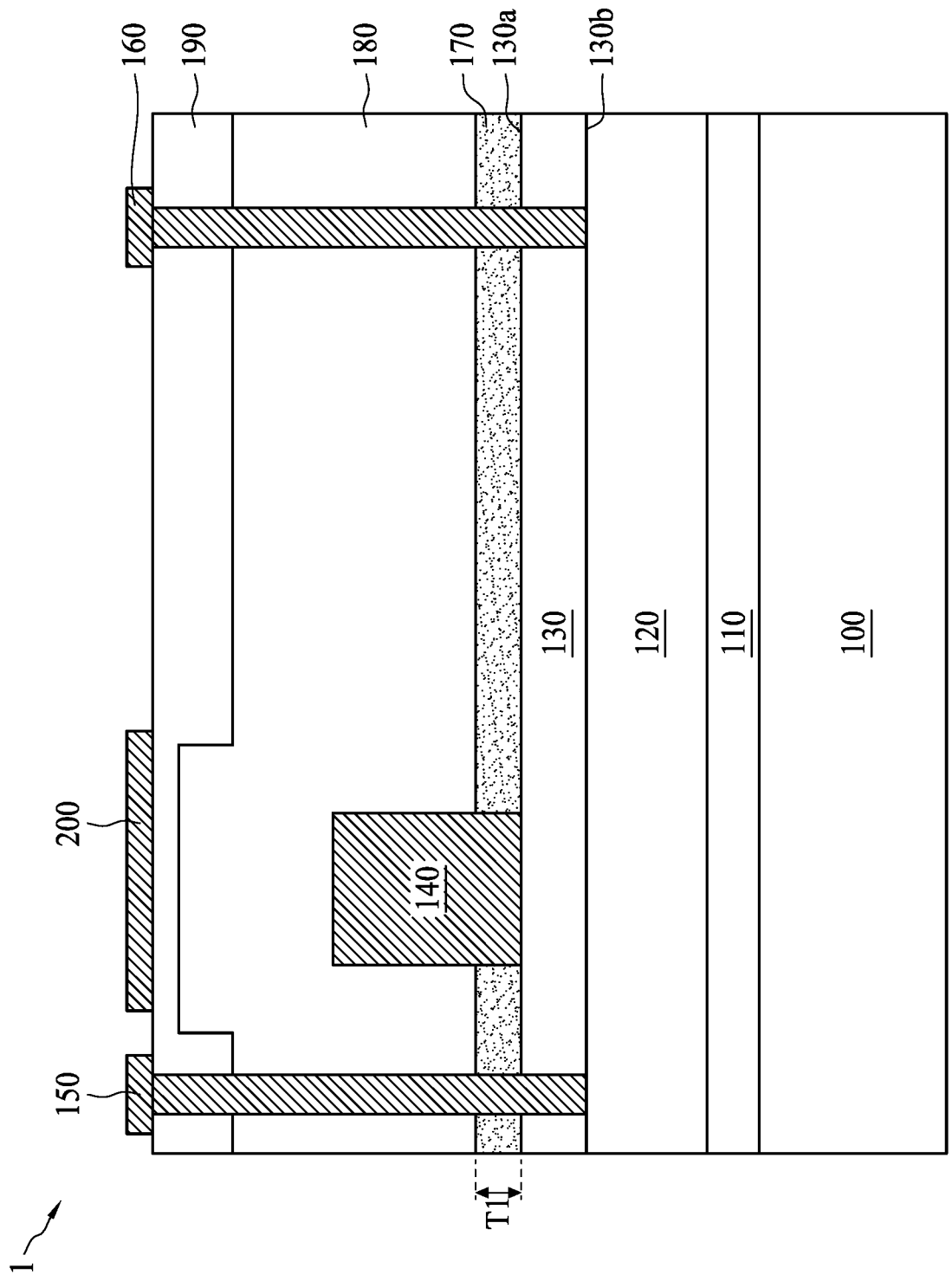
FIG. 1 is a cross-sectional view of a semiconductor device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device 1 in accordance with some embodiments of the present disclosure.

As shown in FIG. 1, the semiconductor device 1 may include a substrate 100, a channel layer 120, a barrier layer 130, a gate 140, and a strained layer 170.

The substrate 100 may include, without limitation, silicon (Si), doped Si, silicon carbide (SiC), germanium silicide (SiGe), gallium arsenide (GaAs), or other semiconductor materials. The substrate 100 may include, without limitation, sapphire, silicon on insulator (SOI), or other suitable materials.

The channel layer 120 is disposed on the substrate 100. The channel layer 120 may include a group III-V layer. The channel layer 120 may include, but is not limited to, a group III nitride, for example, a compound $In_xAl_yGa_{1-x-y}N$, in which $x+y \leq 1$. The group III nitride further includes, but is not limited to, for example, a compound $Al_yGa_{(1-y)}N$, in which $y \leq 1$. In some embodiments, the channel layer 120 includes a gallium nitride (GaN) layer. GaN has a band gap of about 3.4 V. In some embodiments, the thickness of the channel layer 120 ranges, but is not limited to, from about 0.5 μm to about 10 μm.

The barrier layer 130 is disposed on the channel layer 120. The barrier layer 130 may include a group III-V layer. The barrier layer 130 may include, but is not limited to, a group III nitride, for example, a compound $In_xAl_yGa_{1-x-y}N$, in which $x+y \leq 1$. The group III nitride further includes, but is not limited to, for example, a compound $Al_yGa_{(1-y)}N$, in which $y \leq 1$. The barrier layer 130 has a greater bandgap than that of the channel layer 120. In some embodiments, the barrier layer 130 includes an aluminum gallium nitride (AlGaN) layer. AlGaN has a band gap of about 4.0 V. In some embodiments, the thickness of the barrier layer 130 ranges, but is not limited to, from about 10 nm to about 100 nm. The barrier layer 130 has a surface 130a and a surface 130b. The surface 130a and the surface 130b are located on two opposite sides of the barrier layer 130. The surface 130b contacts the channel layer 120.

A heterojunction is formed between the barrier layer 130 and the channel layer 120, and the polarization of the heterojunction of different nitrides forms a 2DEG region in the channel layer 120. The 2DEG region is typically formed in a layer with a small bandgap, such as GaN. The channel layer 120 can provide or remove electrons in the 2DEG region, thereby controlling conduction of the semiconductor device 1.

The gate 140 is disposed on the barrier layer 130. The gate 140 is disposed on the surface 130a. The gate 140 may include, but is not limited to, a gate dielectric layer and a gate metal disposed thereon. The gate dielectric layer may include one or more layers of a dielectric material, such as silicon oxide, silicon nitride, or high-k dielectric material or other suitable dielectric material. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The strained layer 170 is disposed on the barrier layer 130. The strained layer 170 is directly disposed on the surface 130a. In some embodiments, the strained layer 170 is in contact with the surface 130a. The strained layer 170 is configured to modify the stress imposed on the channel layer 120 and/or barrier layer 130. In some embodiments, the strained layer 170 imposes tensile stress on the channel layer 120. The polarization between the channel layer 120 and the barrier layer 130 may be enhanced by imposing a tensile stress on the channel layer 120, thereby enhancing the concentration of electron in 2DEG region. In addition, the strained layer 170, disposed on the barrier layer 130, may assist in decreasing on resistance (Rds-on) of the semiconductor device 1.

In some embodiments, the material of the strained layer 170 includes at least one of silicon nitride, silicon oxide, silicon oxynitride, boron oxide, boron nitride, boron oxynitride, aluminum oxide, aluminum nitride, aluminum oxynitride, titanium oxide and titanium oxynitride. In some embodiments, the material of the strained layer 170 may include AlN. In some embodiments, AlN of the strained layer 170 is formed by chemical vapor deposition (CVD) process.

The strained layer 170 has a thickness T1. In some embodiments, the thickness T1 ranges from about 1 nm to about 20 nm. In some embodiments, the thickness T1 ranges from about 20 nm to about 40 nm. In some embodiments, the thickness T1 ranges from about 40 nm to about 60 nm. In some embodiments, the thickness T1 ranges from about 60 nm to about 80 nm. In some embodiments, the thickness T1 ranges from about 80 nm to about 100 nm. If the thickness T1 is less than 1 nm, tensile stress, imposed on the channel layer 120, is decreased so that the effect of enhancing the polarization may become inapparent. If the thickness T1 is greater than 100 nm, the semiconductor device 1 may have a greater variance of Rds-on, degrading the reliability of the semiconductor device 1.

In some embodiments, the strained layer 170 includes a crystal structure. In some embodiments, the strained layer 170 includes a single crystal structure. The lattice constant of the strained layer 170 ranges from about 3.0 Å to about 3.4 Å. In some embodiments, the lattice constant of the strained layer 170 ranges from about 3.1 Å to about 3.2 Å. In some embodiments, the a or b axis of the strained layer 170 ranges from about 3.1 Å to about 3.2 Å. In some embodiments, the lattice constant of the strained layer 170 is less than that of the barrier layer 130. In some embodiments, when the strained layer 170 is a crystal structure, its thickness ranges from about 1 nm to about 100 nm. In some embodiments, when the strained layer 170 is a crystal structure, its thickness ranges from about 1 nm to about 50 nm. In some embodiments, when the strained layer 170 is a crystal structure, its thickness ranges from about 1 nm to about 10 nm.

In some embodiments, there is lattice constant mismatch between the strained layer 170 and the barrier layer 130. Lattice constant mismatch may be defined as a formula: $(C_a - C_b)/C_a$.

In this embodiment, $C_a$ refers to the lattice constant of the barrier layer 130 and $C_b$ refers to the lattice constant of the strained layer 170.

In some embodiments, lattice constant mismatch between the barrier layer 130 and the strained layer 170 ranges from about 50.0% to about 70.0%. In some embodiments, lattice constant mismatch between the barrier layer 130 and the strained layer 170 ranges from about 70.0% to about 90.0%. In some embodiments, lattice constant mismatch between the barrier layer 130 and the strained layer 170 ranges from about 90.0% to about 99.9%.

Lattice constant can be measured by X-ray diffraction (XRD). The lattice constant mentioned herein may refer to a lattice constant of an axis from the surface 130b toward the surface 130a.

In some embodiments, the strained layer 170 is a multi-layer made of a combination of above materials. The lattice constant of this multi-layer increases from the surface 130b toward the surface 130a.

When the strained layer 170 is a crystal structure, the stress imposed on the channel layer 120 may be enhanced, thereby increasing polarization between the channel layer 120 and the barrier layer 130.

In some embodiments, the strained layer 170 includes an amorphous structure. In this embodiment, the material of the strained layer 170 may include silicon oxide, silicon nitride or aluminum oxide. In some embodiments, when the strained layer 170 is an amorphous structure, its thickness ranges from about 1 nm to about 100 nm. In some embodiments, when the strained layer 170 is an amorphous structure, its thickness ranges from about 10 nm to about 80 nm. In some embodiments, when the strained layer 170 is an amorphous structure, its thickness ranges from about 20 nm to about 50 nm.

The semiconductor device 1 further includes a buffer layer 110. The buffer layer 110 is disposed between the substrate 100 and the channel layer 120. In some embodiments, the buffer layer 110 is configured to reduce defect due to the dislocation between the substrate 100 and the subsequently formed III-V compound layer. The buffer layer 110 may include, but is not limited to, nitride, such as AlN, AlGaN or the like.

The semiconductor device 1 further includes a passivation layer 180. The passivation layer 180 is disposed on the strained layer 170. The passivation layer 180 covers the gate 140 and the strained layer 170. In some embodiments, the passivation layer 180 includes, but is not limited to, oxide or nitride, such as SiN, SiO$_2$ and the like. The passivation layer 180 may include, but is not limited to, a composite layer of an oxide and a nitride, such as Al$_2$O$_3$/SiN, Al$_2$O$_3$/SiO$_2$, AlN/SiN, AlN/SiO$_2$, and the like. In some embodiments, the material of the passivation layer 180 differs from that of the strained layer 170.

The semiconductor device 1 further includes a planarization layer 190. The planarization layer 190 provides a substantially flat surface so that the layers or elements (not shown) can be formed on the surface thereof. The planarization layer 190 may include, but is not limited to, oxide or nitride, such as SiN, SiO$_2$ and the like.

The semiconductor device 1 further includes a source 150 and a drain 160. Although the source 150 and drain 160 are respectively disposed on two opposite sides of the gate 140 in FIG. 1, the source 150, the drain 160, and the gate 140 may have different configurations in other embodiments of the present disclosure due to the design requirements.

In some embodiments, the source 150 and drain 160 may include, for example, without limitation, a conductor material. The conductor materials may include, but is not limited to, for example, metals, alloys, doped semiconductor materials (e.g., doped crystalline silicon), or other suitable conductor materials.

In some embodiments, a portion of the source 150 may be located in the channel layer 120. A portion of the drain 160 may be located in the channel layer 120. In some other embodiments, the source 150 may be disposed on the channel layer 120. In some other embodiments, the drain 160 may be disposed on the channel layer 120. In some embodiments, the source 150 may run through the planarization layer 190, the passivation layer 180, the strained layer 170 and the barrier layer 130 to contact the channel layer 120. In some embodiments, the drain 160 may run through the planarization layer 190, the passivation layer 180, the strained layer 170 and the barrier layer 130 to contact the channel layer 120.

The semiconductor device 1 further includes a field plate 200. The field plate 200 may be disposed on the planarization layer 190. In some embodiments, the field plate 200 may be disposed directly over the gate 140. The field plate 200 may include, but is not limited to, conductive materials. The conductive materials may include, but is not limited to, for example, metals, alloys, doped semiconductor materials (e.g., doped crystalline silicon), or other suitable conductive materials. The field plate 200 can be at zero potential. Although FIG. 1 merely illustrates one field plate 200 in the semiconductor device 1, the semiconductor device 1 can have more than one field plate in other embodiments.

In some embodiments, the semiconductor device 1 is a depletion-mode device, which is preset to be in an ON state when the gate 140 is in a zero bias state.

In some embodiments, the semiconductor device 1 is an enhancement-mode device, which is preset to be in an OFF state when the gate 140 is in a zero bias state. Applying a voltage across the gate 140 induces electrons or charges in a region below the gate 140, which may be referred to as an electron or charge inversion layer. As the voltage increases, the number of electrons or charges that are induced increases. The minimum voltage that is applied to form the inversion layer is called the threshold voltage, expressed as Vth.

Figure 2:
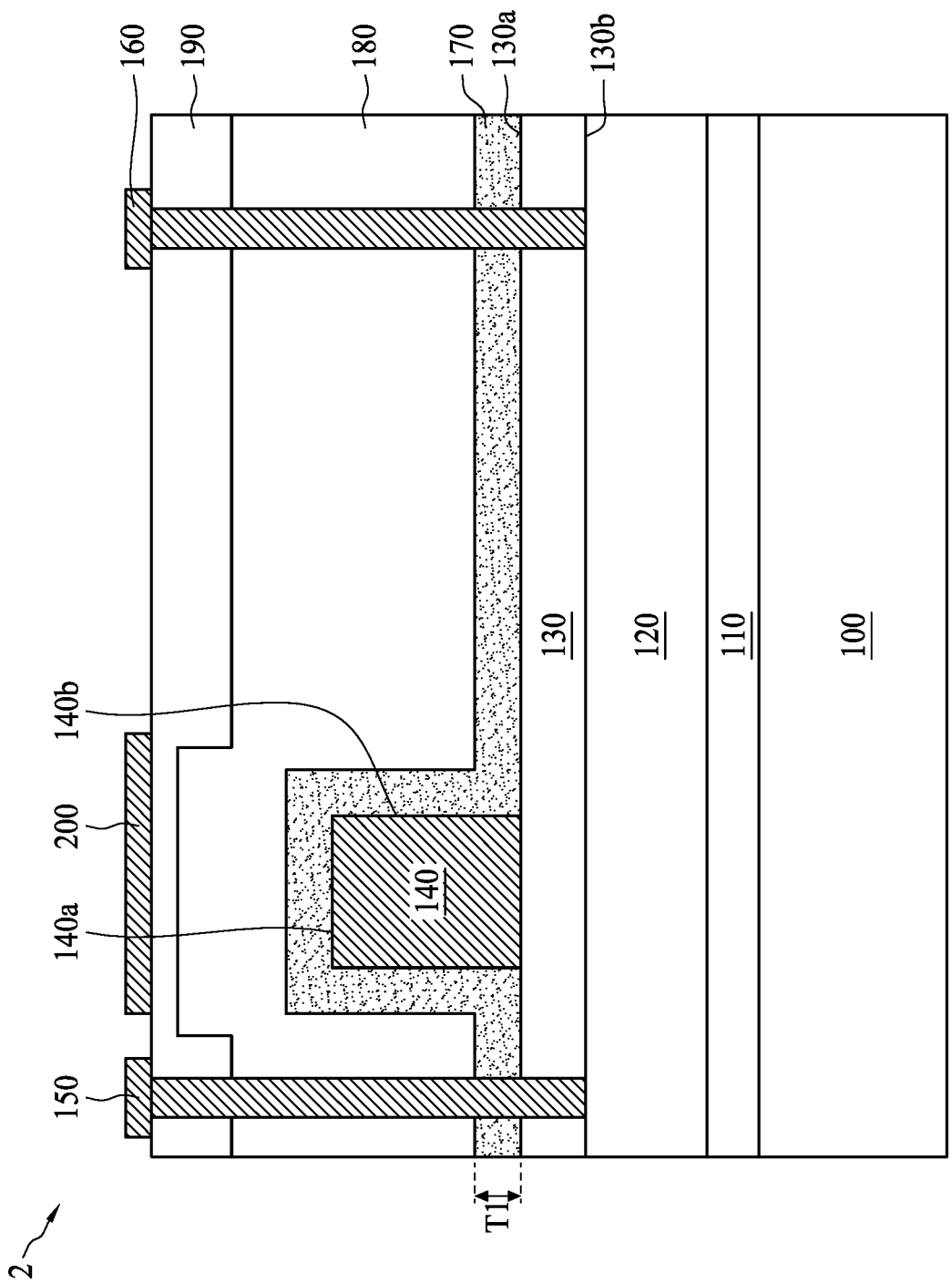
FIG. 2 is a cross-sectional view of a semiconductor device in accordance with some embodiments of the present disclosure.

FIG. 2 is a cross-sectional view of a semiconductor device 2 in accordance with some embodiments of the present disclosure.

The semiconductor device 2 has a structure similar to or the same as the semiconductor device 1 of FIG. 1, with one difference that the strained layer 170 of the semiconductor device 2 further covers the gate 140.

As shown in FIG. 2, the gate 140 has a surface 140a and a surface 140b. The surface 140a is substantially parallel to the surface 130a. The surface 140b is substantially perpendicular to the surface 140a. The surface 140a may also be referred to as an upper surface of the gate 140. The surface 140b may also be referred to as a side surface of the gate 140.

In some embodiments, the strained layer 170 may cover the surfaces 140a and 140b. In some embodiments, the strained layer 170 covers the surface 140a but not the surface 140b. In some embodiments, the strained layer 170 covers the surface 140b but not the surface 140a. In some embodiments, the strained layer 170 conformally covers the gate 140.

The process for manufacturing the semiconductor device 2 may be simplified by forming the strained layer 170 covering the surface 140a and/or surface 140b, thereby reducing a cost.

Figure 3:
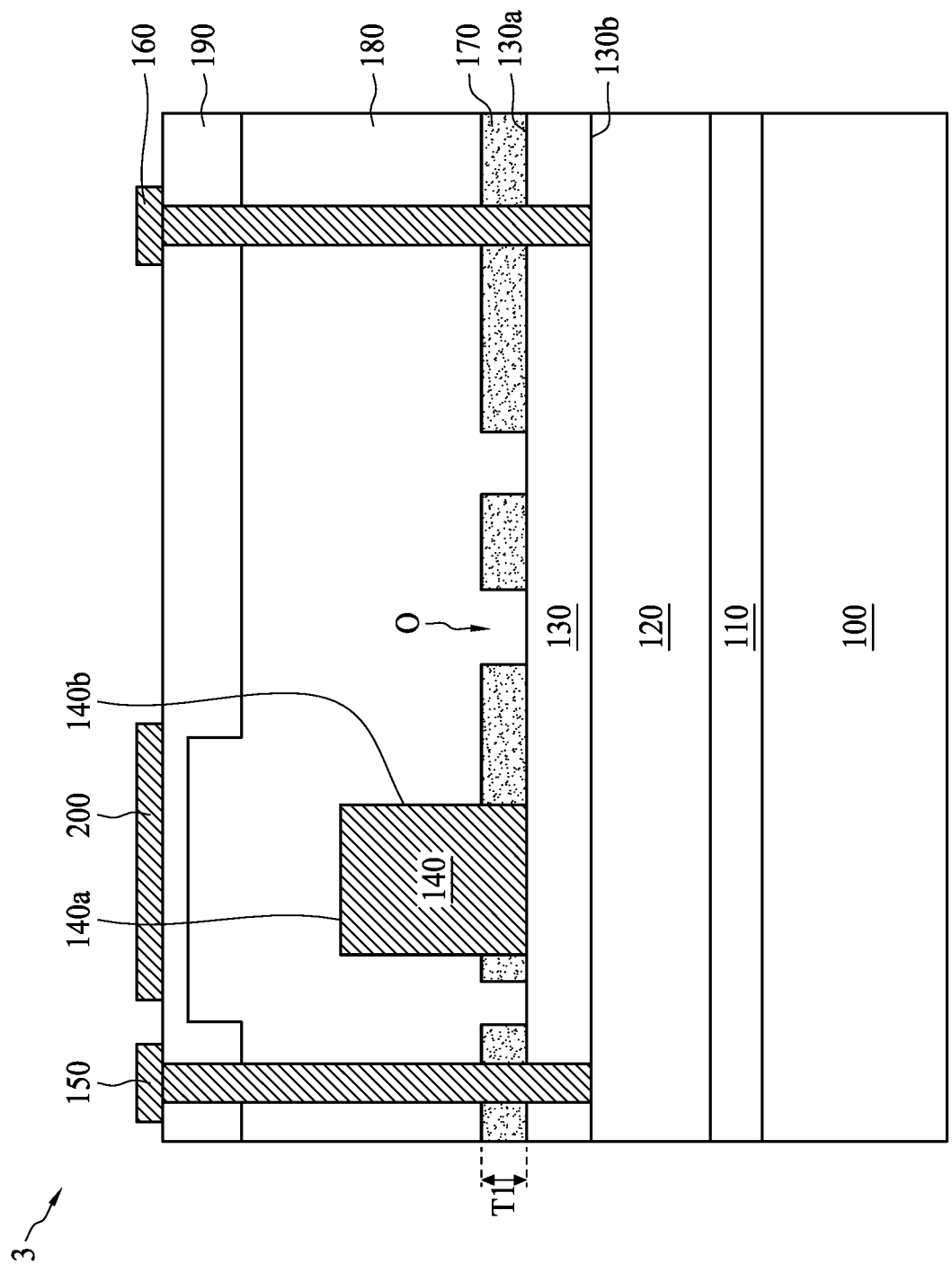
FIG. 3 is a cross-sectional view of a semiconductor device in accordance with some embodiments of the present disclosure.

FIG. 3 is a cross-sectional view of a semiconductor device 3 in accordance with some embodiments of the present disclosure.

The semiconductor device 3 has a structure similar to or the same as the semiconductor device 1 of FIG. 1, with one difference that the strained layer 170 of the semiconductor device 3 includes multiple openings O.

In some embodiments, after the material of the strained layer 170 is deposited, etching may be performed to pattern the strained layer 170. As shown in FIG. 3, the opening O exposes the barrier layer 130, and the passivation layer 180 extends to the barrier layer 130 through the opening O. In some embodiments, the ratio between the portion of the barrier layer 130 not covered by the strained layer 170 and that covered by the strained layer 170 ranges from 1:99 to 5:95. In some embodiments, the ratio between the portion of the barrier layer 130 not covered by the strained layer 170 and covered by the strained layer 170 ranges from 5:95 to 10:90. In some embodiments, the ratio between the portion of the barrier layer 130 not covered by the strained layer 170 and covered by the strained layer 170 ranges from 10:90 to 20:80. In some embodiments, the ratio between the portion of the barrier layer 130 not covered by the strained layer 170 and covered by the strained layer 170 ranges from 20:80 to 40:60. Whether the strained layer 170 covers the barrier layer 130 can be determined from a top view. When the strained layer 170 is located directly over the barrier layer 130, it can be determined that the strained layer 170 covers the barrier layer 130.

By patterning the strained layer 170 such that the ratio falls within the stated ranges, electricity properties of the semiconductor device may be optimized, such as, for example, prevention of electric field concentrating under the edge of the gate 140 resulting in leakage current.

In addition, as the ratio between the portion of the barrier layer 130 not covered by the strained layer 170 and covered by the strained layer 170 changes, the thickness T1 of the strained layer 170 may accordingly be modified. In some embodiments, when the ratio of the portion of the barrier layer 130 covered by the strained layer 170 ranges from 95% to 99%, the thickness T1 ranges from 1 nm to 100 nm.

Figure 4:
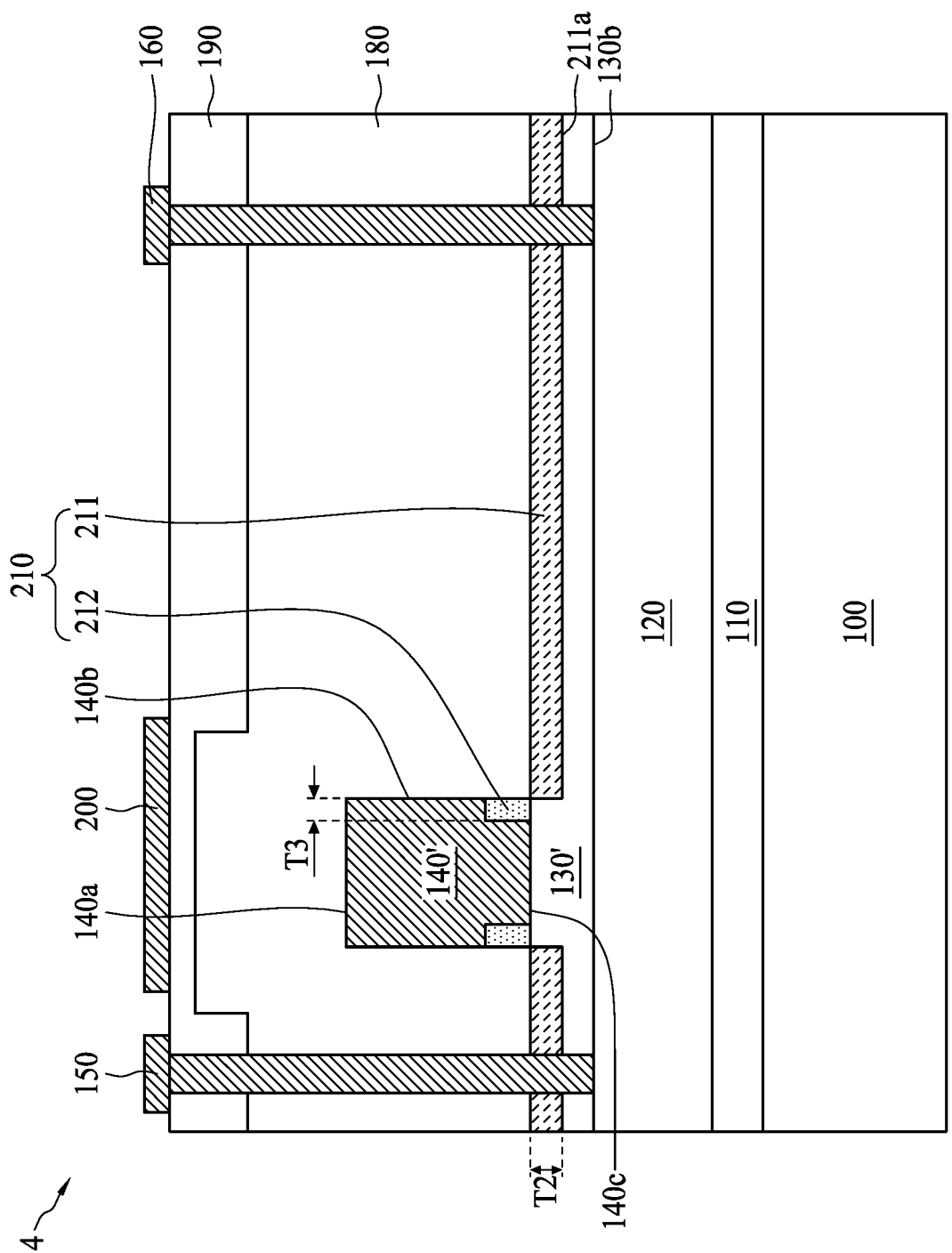
FIG. 4 is a cross-sectional view of a semiconductor device in accordance with some embodiments of the present disclosure.

FIG. 4 is a cross-sectional view of a semiconductor device 4 in accordance with some embodiments of the present disclosure.

The semiconductor device 4 has a structure similar to or the same as the semiconductor device 1 of FIG. 1, with one difference that the semiconductor device 4 further includes a strained layer 210 replacing the strained layer 170.

In some embodiments, the strained material may react with the barrier layer and/or the gate by heat treatment. For example, the atoms of the strained material can diffuse into the barrier layer and/or the gate by heat treatment so that a portion 211 and a portion 212 are formed. In this embodiment, the profile of the barrier layer and/or the gate changes due to the reaction between a strained material and the barrier layer and/or the gate. As a result, a barrier layer 130' and/or a gate 140' is formed. In some embodiments, a bottom surface 211a of the portion 211 is not coplanar with a bottom surface 140c of the gate 140'.

In some embodiments, the component of the portion 211 differs from that of the portion 212. In some embodiments, the portion 211 may include Al, N, Si or O. In some embodiments, the portion 212 may include Al, N, Si or O. The portion 212 may further include the element of the gate 140, such as Ti, Ta, W, Al, Co, Cu, Ni, Pt, Pb, Mo and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The portion 211 has a thickness T2. The portion 212 has a thickness T3. The thickness T2 differs from the thickness T3 due to the atom of the strained layer 210 with different diffusion rates into different materials.

In some embodiments, the lattice of the strained layer 210 changes through heat treatment, thereby modifying the stress imposed on the barrier layer 130. Accordingly, the polarization between the channel layer 120 and the barrier layer 130 can be controlled.

Figure 5:
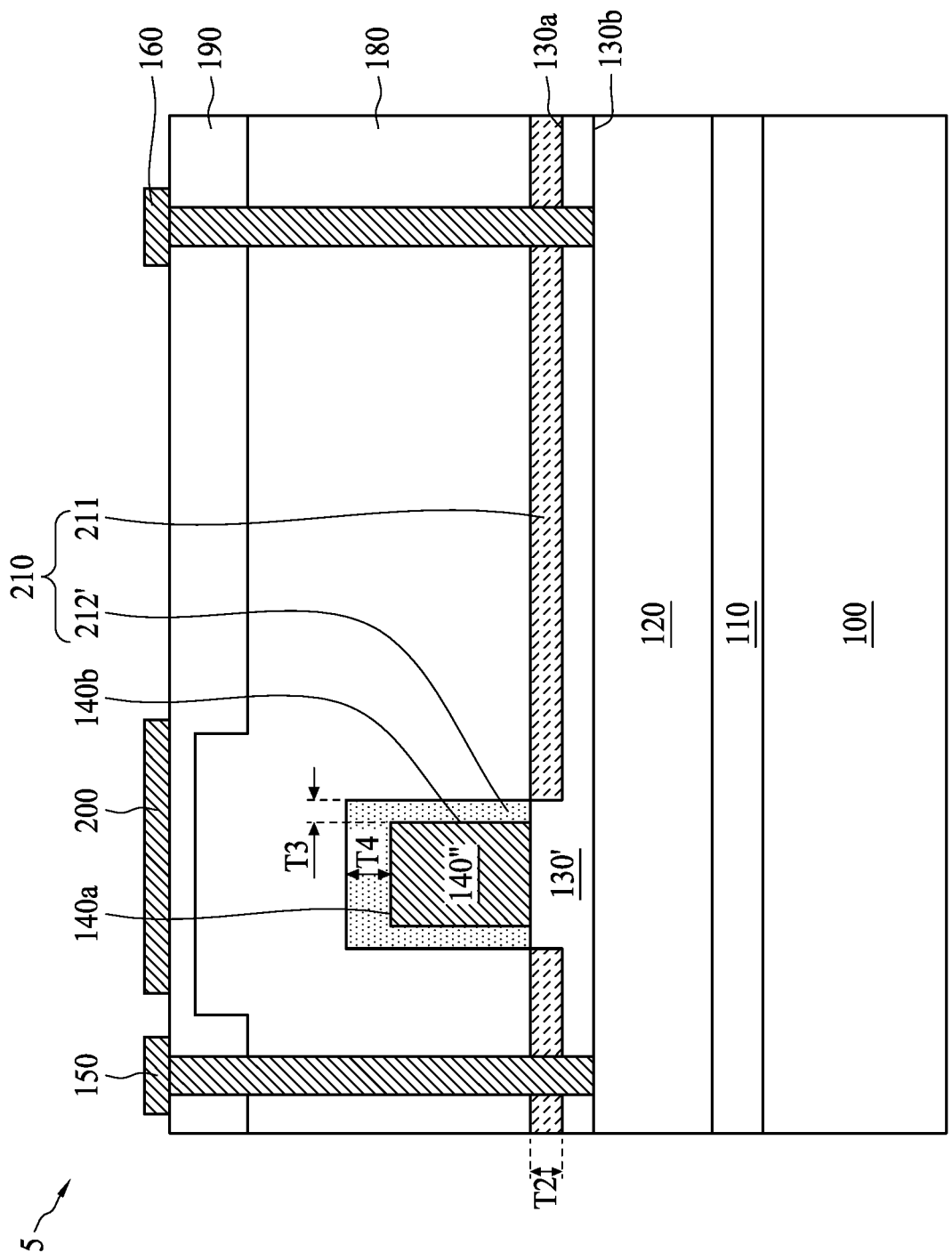
FIG. 5 is a cross-sectional view of a semiconductor device in accordance with some embodiments of the present disclosure.

FIG. 5 is a cross-sectional view of a semiconductor device 5 in accordance with some embodiments of the present disclosure.

The semiconductor device 5 has a structure similar to or the same as the semiconductor device 1 of FIG. 1, with one difference that the strained layer 210 of the semiconductor device 5 includes a portion 212' replacing the portion 212.

In some embodiments, the portion 212' may cover the surfaces 140a and 140b of the gate 140". The portion 212' has a thickness T4 on the surface 140a. The portion 212' has a thickness T3 on the surface 140b. In some embodiments, the thickness T3 differs from the thickness T4. In some embodiments, the thickness T3 is equivalent to the thickness T4.

FIG. 6A, FIG. 6B, FIG. 6C, FIG. 6D and FIG. 6E illustrate various stages of a method for manufacturing a semiconductor device in accordance with some embodiments of the present disclosure.

Figure 6A:
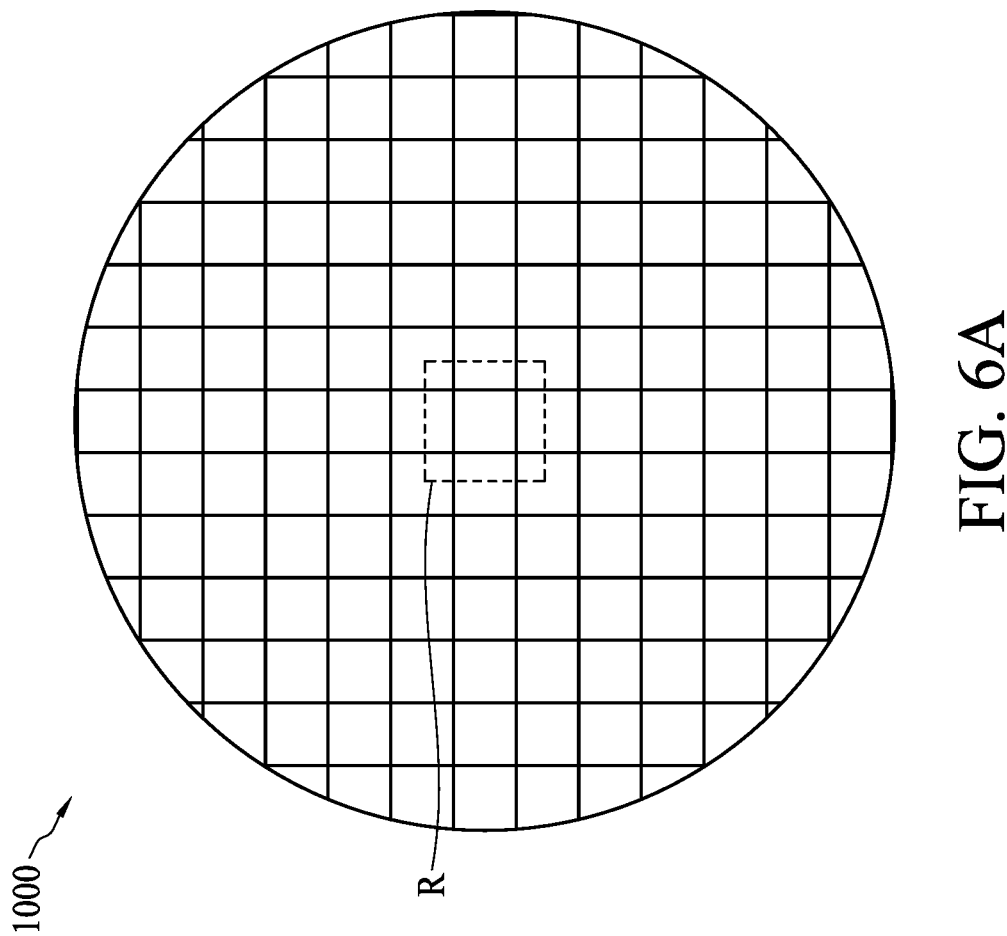
FIG. 6A is a top view of an entire semiconductor device structure in accordance with some embodiments of the present disclosure.

FIG. 6A is a top view of an entire structure 1000 in accordance with some embodiments of the present disclosure.

The entire structure 1000 includes a substrate 100 and layers as well as components formed thereon. The entire structure 1000 includes multiple uncut semiconductor chips R. In some embodiments, each of the semiconductor chips R may correspond to, but is not limited to, one semiconductor device 1. In some embodiments, each of the semiconductor chips R may correspond to one semiconductor device 2, 3, 4 or 5.

FIG. 6B, FIG. 6C, FIG. 6D and FIG. 6E are cross-sectional views of the entire structure 1000 shown in FIG. 6A.

Figure 6B:
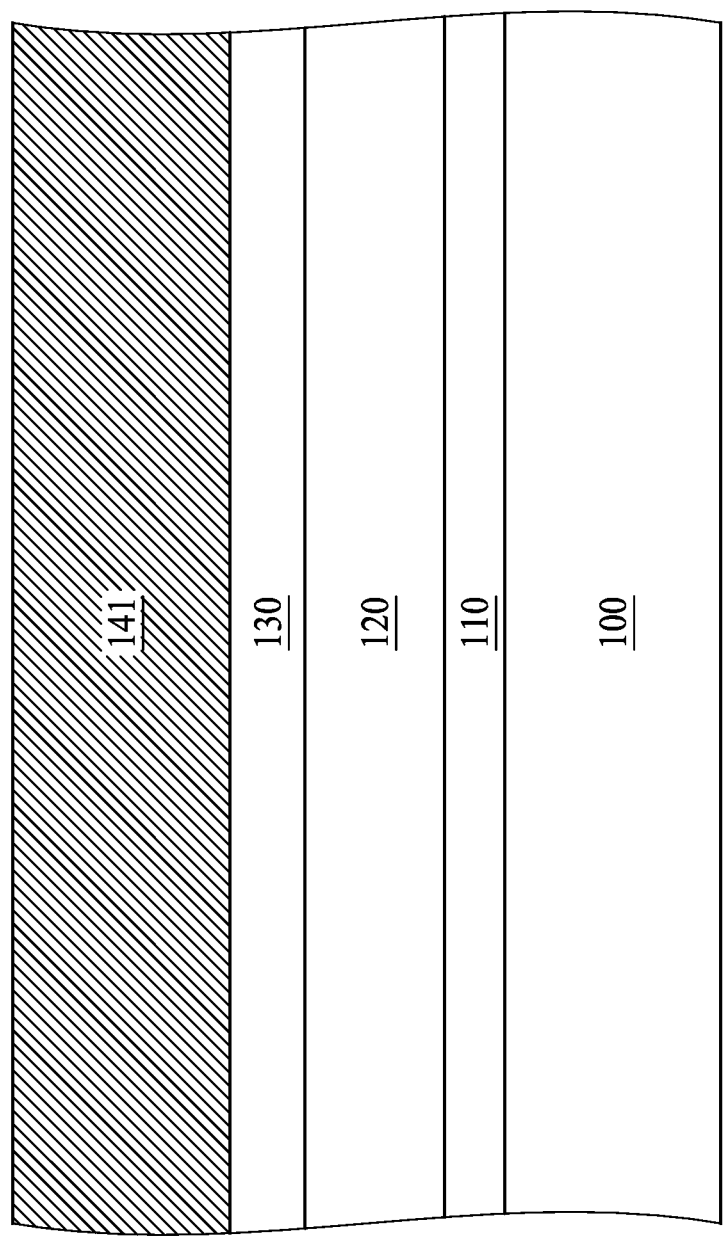
FIG. 6B, FIG. 6C, FIG. 6D and FIG. 6E illustrate various stages of a method for manufacturing a semiconductor device in accordance with some embodiments of the present disclosure.

As shown in FIG. 6B, a substrate 100 is provided. A buffer layer 110, a channel layer 120, a barrier layer 130 and an unpatterned gate material 141 are formed on the substrate 100. The buffer layer 110, channel layer 120 and/or barrier layer 130 may be formed by metal organic chemical vapor deposition (MOCVD), epitaxial growth, or other suitable processes. The gate material 141 may be formed by depositing one or more layers through physical vapor deposition (PVD), chemical vapor deposition (CVD), and/or other suitable processes.

Figure 6C:
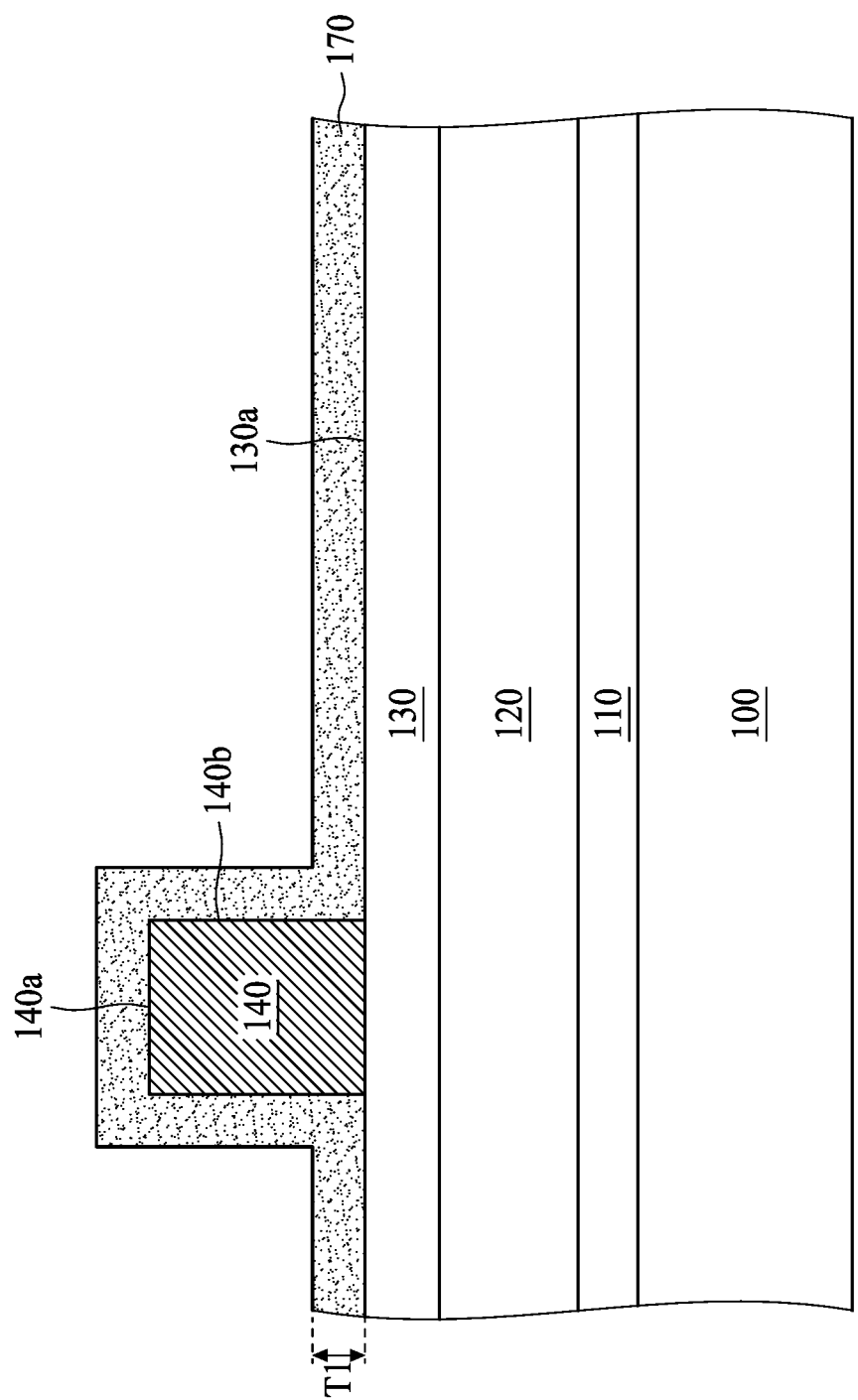

As shown in FIG. 6C, the gate material 141 is patterned to form the gate 140, and the strained layer 170 is formed to cover the gate 140. In some embodiments, the strained layer 170 is formed by MOCVD so that the strained layer 170 can have a single crystal structure. The strained layer 170 covers the barrier layer 130 and the gate 140. The strained layer 170 may conformally cover the surfaces 140a and 140b of the gate 140 and the surface 130a of the barrier layer 130. In some embodiments, the strained layer 170 may be an amorphous structure. The strained layer 170 may be made amorphous by control of the parameters of the process, dopants or other suitable methods. The stress imposed on the channel layer 120 can be modified through forming the strained layer 170, resulting in enhancing the concentration of electron in 2DEG region.

Figure 6D:
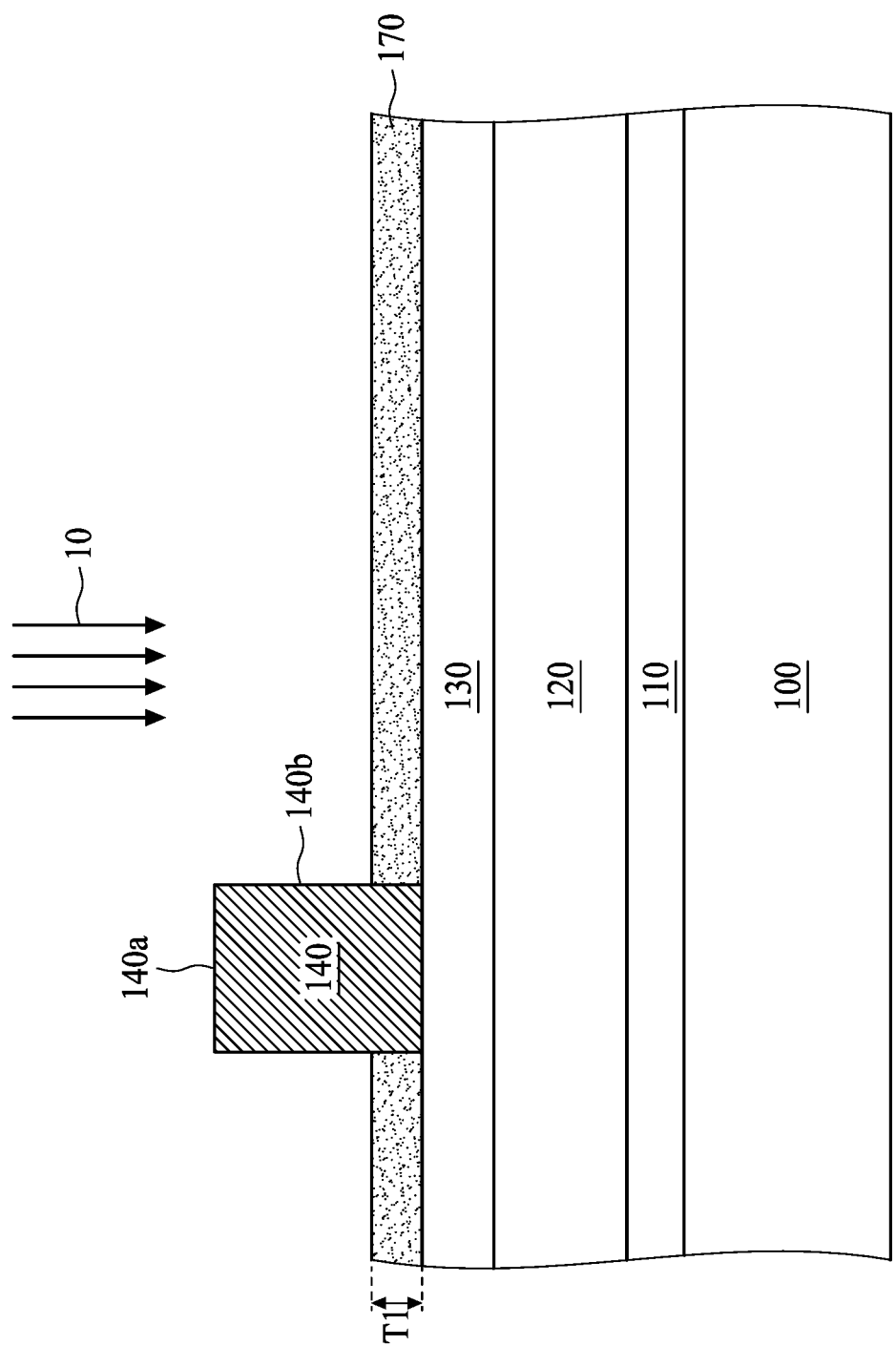

As shown in FIG. 6D, in some embodiments, etching 10 may be performed to remove a portion of the strained layer 170. For example, the portions of the strained layer 170 that are on the surface 140a and/or 140b can be removed to expose the surface 140a and/or a portion of the surface 140b of the gate 140, thereby producing the semiconductor device 1 shown in FIG. 1. Etching process may include, but is not limited to, dry etching, such as anisotropic etching. In some embodiments, after the portions of the strained layer 170 on the surface 140a and/or 140b are removed, another etching process (not shown) is performed such that openings, formed in the strained layer 170, exposes the barrier layer 130, thereby producing the semiconductor device 3 shown in FIG. 3. In some embodiments, the etching process can be omitted such that the strained layer 170 covers the surfaces 140a and 140b of the gate 140, thereby producing the semiconductor device 2 shown in FIG. 2.

Figure 6E:
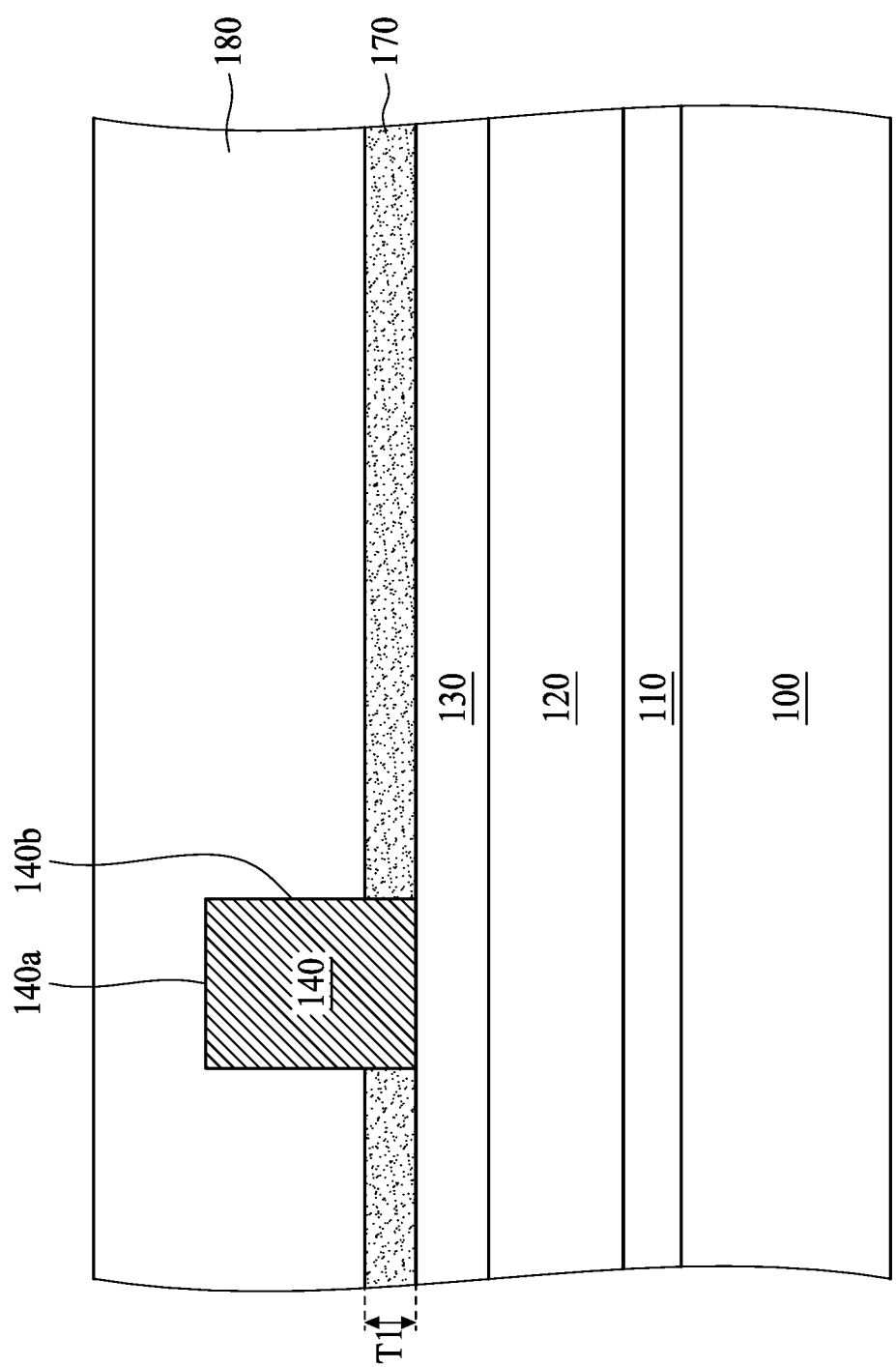

As shown in FIG. 6E, a passivation layer 180 is formed on the strained layer 170. The passivation layer 180 may be formed by CVD, high density plasma CVD (HDPCVD), spin-on, sputtering process or the like. The passivation layer 180 covers the gate 140 and the strained layer 170.

After the passivation layer 180 is formed, a planarization layer 190, a source 150, a drain 160 and a field plate 200 are formed to produce the semiconductor device 1 shown in FIG. 1

The planarization layer 190 may be formed by CVD, HDPCVD, spin-on, sputtering process or the like. After the planarization layer 190 is formed, a chemical mechanical polishing (CMP) process may be performed to planarize the upper surface of the planarization layer 190.

Next, portions of the planarization layer 190, passivation layer 180, strained layer 170 and barrier layer 130 are removed by one or more etching processes, to form openings. After the openings are formed, conductive materials may be filled into the openings by CVD, PVD or electroplating. In some embodiments, after the material is filled into the holes, the deposited material is etched again through a mask to form a desired electrode structure so that the source 150 and drain 160 are formed and in contact with the channel layer 120. The source 150 and drain 160 may be formed by sputtering, PVD or other suitable processes. In some embodiments, the deposited material forms an intermetallic compound with the channel layer 120 through rapid thermal anneal (RTA), thereby forming an ohmic contact. In some embodiments, the field plate 200, source 150 and/or drain 160 may be formed in the same process. In some embodiments, the field plate 200, source 150 and/or drain 160 may be formed in different processes. In addition, the source 150, drain 160 and/or field plate 200 may be patterned by photolithography, etching processes or the like.

FIG. 7A, FIG. 7B, FIG. 7C and FIG. 7D illustrate side views of the entire structure 1000 in accordance with some embodiments of the present disclosure. The warpage of the entire structure 1000 can be determined through an inspection of FIG. 7A, FIG. 7B, FIG. 7C and FIG. 7D.

FIG. 7A is a cross-sectional view of the entire structure 1000 corresponding to the stage of FIG. 6A at which no elements or components are formed on the substrate 100. When there is no elements formed on the substrate 100, warping is substantially avoided.

FIG. 7B is a cross-sectional view of the entire structure 1000 corresponding to the stage of FIG. 6B. When the buffer layer 110, channel layer 120, barrier layer 130 and gate material 141 are formed, stress is imposed on the entire structure 1000, due to materials with different thermal expansion coefficients and/or lattice constants, subjecting the entire structure 1000 to angularity, causing warpage. In some embodiments, the side view of the entire structure 1000 may have an inverted-U profile.

The angularity may be determined by an inspection of a height difference between the edge of the entire structure 1000 and reference point P. The more the difference between the edge of the entire structure 1000 and reference point P is, the more the angularity is. Reference point P may be the topmost or bottommost point of the entire structure 1000. As shown in FIG. 7B, there is a height difference H1 between the edge of the entire structure 1000 and reference point P.

FIG. 7C is a cross-sectional view of the entire structure 1000 corresponding to the stage of FIG. 6C. In some embodiments, the strained layer 170 may modify the vertical or horizontal stress that is imposed on the channel layer 120 and/or barrier layer 130, thereby compensating the angularity of the entire structure 1000. As shown in FIG. 7C, there is a height difference H2 between the edge of the entire structure 1000 and reference point P. In some embodiments, H2 is less than H1. That is, the angularity of the entire structure 1000 of FIG. 7C is less than that of FIG. 7B. The angularity may be compensated by forming the strained layer 170, thereby enhancing process window.

FIG. 7D is a cross-sectional view of the entire structure 1000 corresponding to the stage of FIG. 6E. After the passivation layer 180 is formed, there is a height difference H3 between the edge of the entire structure 1000 and reference point P. In some embodiments, H3 is greater than H2. That is, the angularity of the entire structure 1000 of FIG. 7D is greater than that of FIG. 7C.

When the process arrives at further subsequent stages, the angularity of the entire structure 1000 increases with addition of layers or components with different thermal expansion coefficients, Young's modulus or lattice constant. In this embodiment, the strained layer 170 is formed, assisting in enhancing the concentration of electrons in 2DEG region by modifying the stress imposed on the channel layer 120. In addition, the formation of the strained layer 170 also improves process window by compensating the angularity of the entire structure 1000.

Figure 8A:
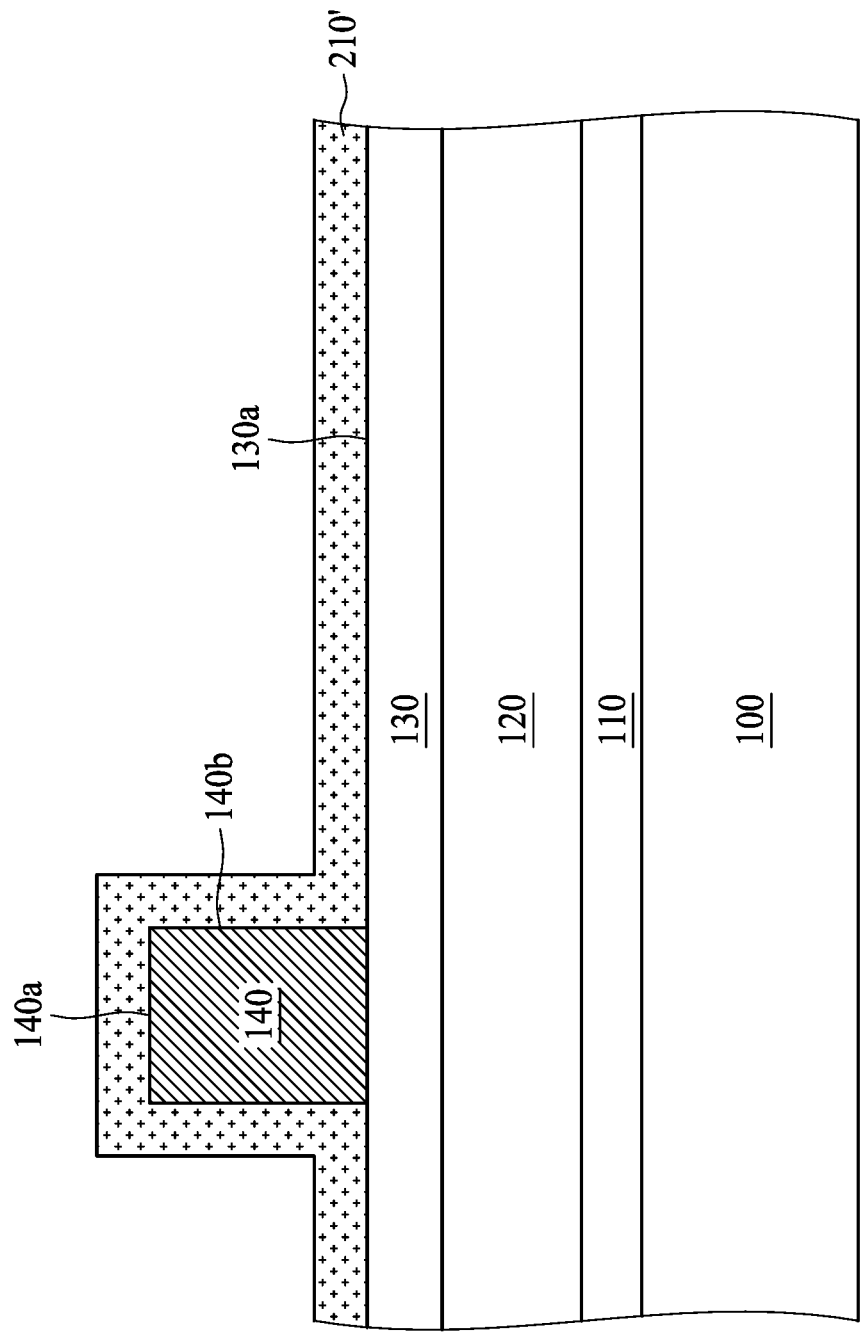
FIG. 8A, FIG. 8B and FIG. 8C illustrate various stages of a method for manufacturing a semiconductor device in accordance with some embodiments of the present disclosure.
Figure 8B:
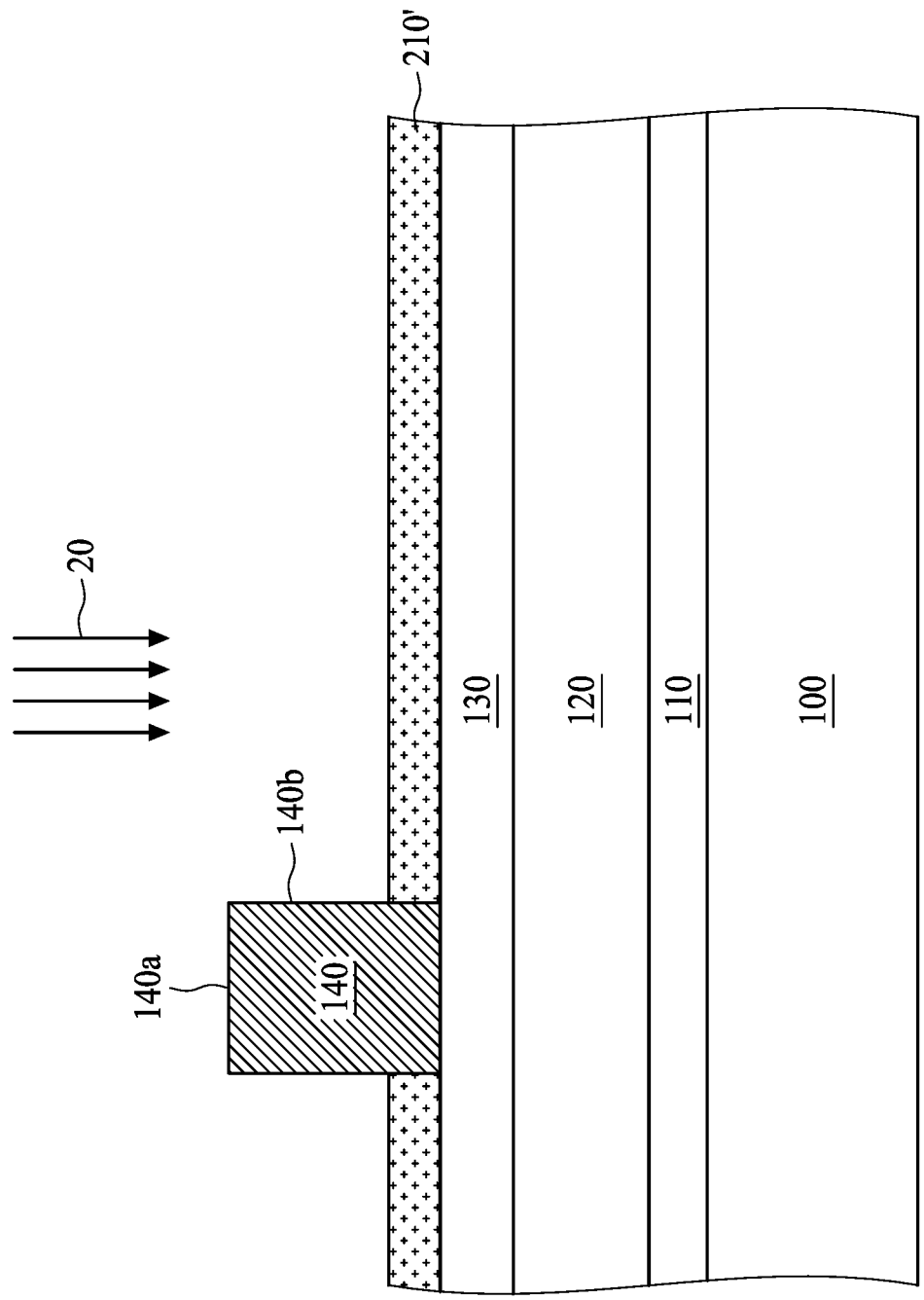
Figure 8C:
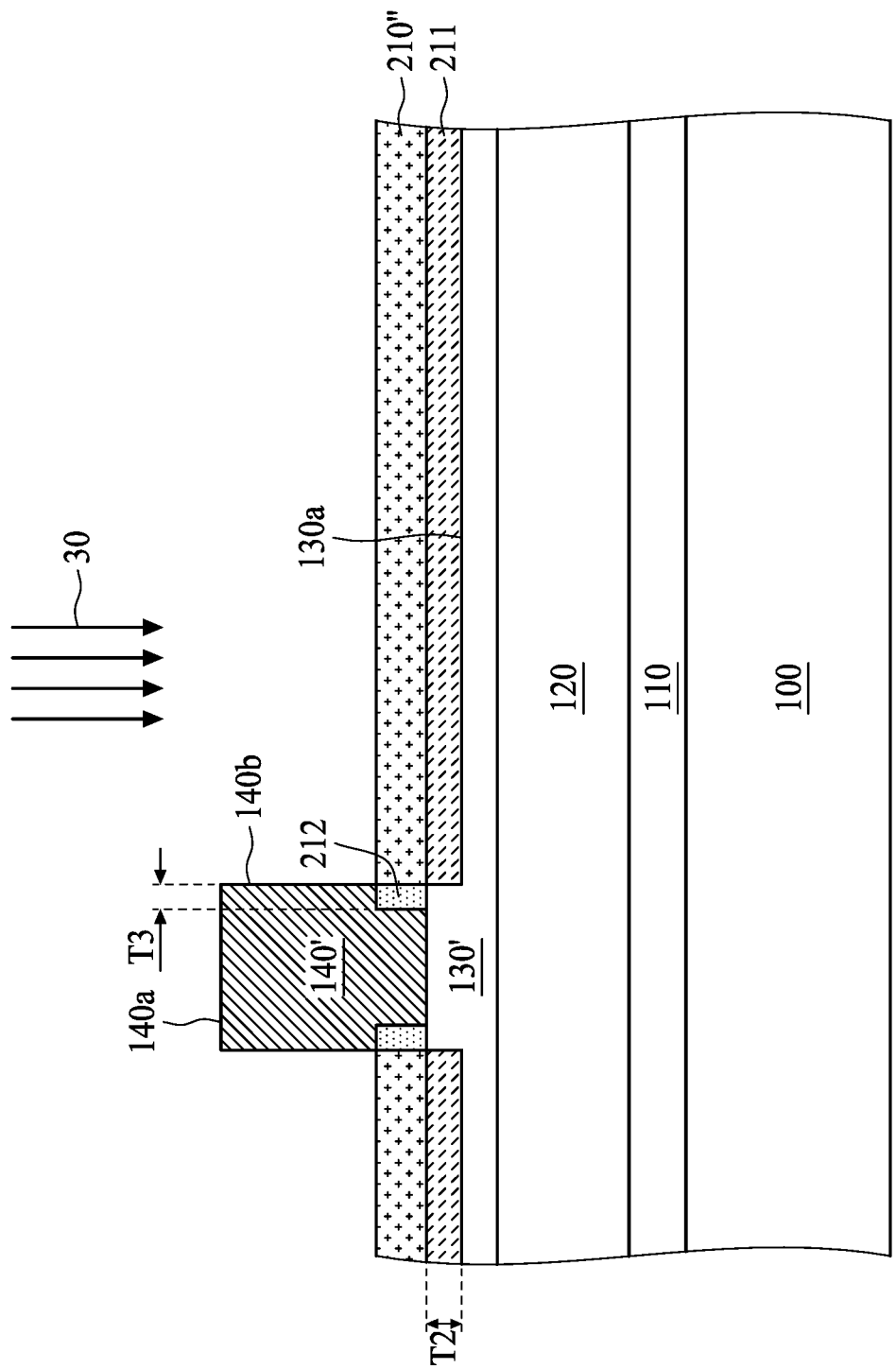

FIG. 8A, FIG. 8B and FIG. 8C illustrate various stages of a method for manufacturing a semiconductor device in accordance with some embodiments of the present disclosure.

As shown in FIG. 8A, a substrate 100 is provided. A buffer layer 110, a channel layer 120, a barrier layer 130 and a gate 140 are formed on the substrate 100. Next, a strained material 210' is deposited to cover the surface 130a of the barrier layer 130 and the surface 140a of the gate 140. The strained material 210' may be formed by depositing one or more layers through PVD, CVD, electroplating, MOCVD and/or other suitable processes. In some embodiments, the strained material 210' includes a crystal structure. In some embodiments, the strained material 210' includes a single crystal structure. In some embodiments, the material of the strained material 210' may include at least one of silicon nitride, silicon oxide, silicon oxynitride, boron oxide, boron nitride, boron oxynitride, aluminum oxide, aluminum nitride, aluminum oxynitride, titanium oxide and titanium oxynitride.

As shown in FIG. 8B, in some embodiments, etching 20 may be performed to remove a portion of the strained material 210'. For example, the portions of the strained material 210' that are on the surface 140a and/or 140b are removed to expose the surface 140a and/or a portion of the surface 140b of the gate 140. Etching process may include, but is not limited to, dry etching, such as anisotropic etching.

As shown in FIG. 8C, heat treatment 30 is performed so that the strained material 210' may react with the barrier layer 130 and/or gate 140. The atoms of the strained material 210' diffuse into the barrier layer 130 through the surface 130a to form the portion 211. The atoms of the strained material 210' diffuse into the gate 140 through the surface 140b to form the portion 212. In some embodiments, the heat treatment 30 includes RTA or other suitable process. After the heat treatment 30, the component of the strained material 210" may be different from that of the strained material 210'. In some embodiments, the component of the strained material 210" may be the same as that of the strained material 210'. As shown in FIG. 8C, the portion 211 is formed between the strained material 210" and the barrier layer 130'. The portion 212 is formed between the gate 140' and the strained material 210".

In some embodiments, the portion 211 may include Al and N. The portion 212 may include Al, N and the metal components included in the gate 140. Since the portions 211 and portion 212 are formed by heat treatment, the elements mentioned above are not uniform. For example, the portion 211 may have a greater concentration of Al and/or N at a side adjacent to the barrier layer 130' and have a less concentration of Al and/or N at a side far from the barrier layer 130'. Alternatively, the portion 211 may have a less concentration of Al and/or N at a side adjacent to the barrier layer 130' and have a greater concentration of Al and/or N at a side far from the barrier layer 130'. The present disclosure is not intended to be limited thereto.

The portion 212 may have a greater concentration of Al and/or N at a side adjacent to the gate 140' and have a less concentration of Al and/or N at a side far from the gate 140'. Alternatively, the portion 212 may have a less concentration of Al and/or N at a side adjacent to the gate 140' and have a greater concentration of Al and/or N at a side far from the gate 140'. The present disclosure is not intended to be limited thereto.

Since the atoms of the strained material 210' have different diffusion rates into different materials, the thickness of the portion 212 differs from that of the portion 211 and thickness T2 differs from thickness T3.

In some embodiments, the portion of the strained material 210' that does not react with the barrier layer 130 and/or gate 140 may be removed by etching. That is, the strained material 210" may be removed. After the strained material 210" is removed, the source 150, drain 160, passivation layer 180, planarization layer 190 and field plate 200 are formed, thereby producing the semiconductor device 4 as shown in FIG. 4.

Figure 9A:
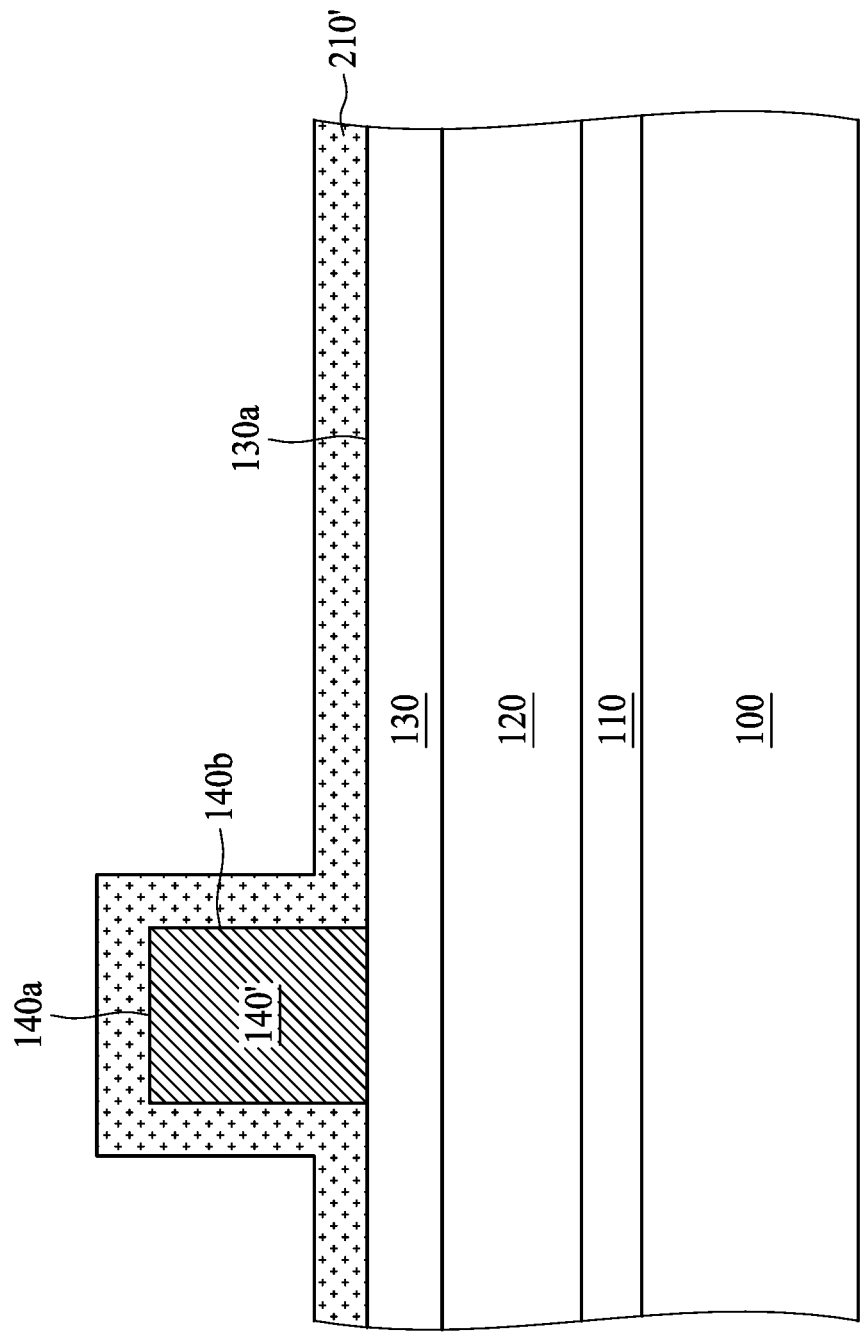
FIG. 9A and FIG. 9B illustrate various stages of a method for manufacturing a semiconductor device in accordance with some embodiments of the present disclosure.
Figure 9B:
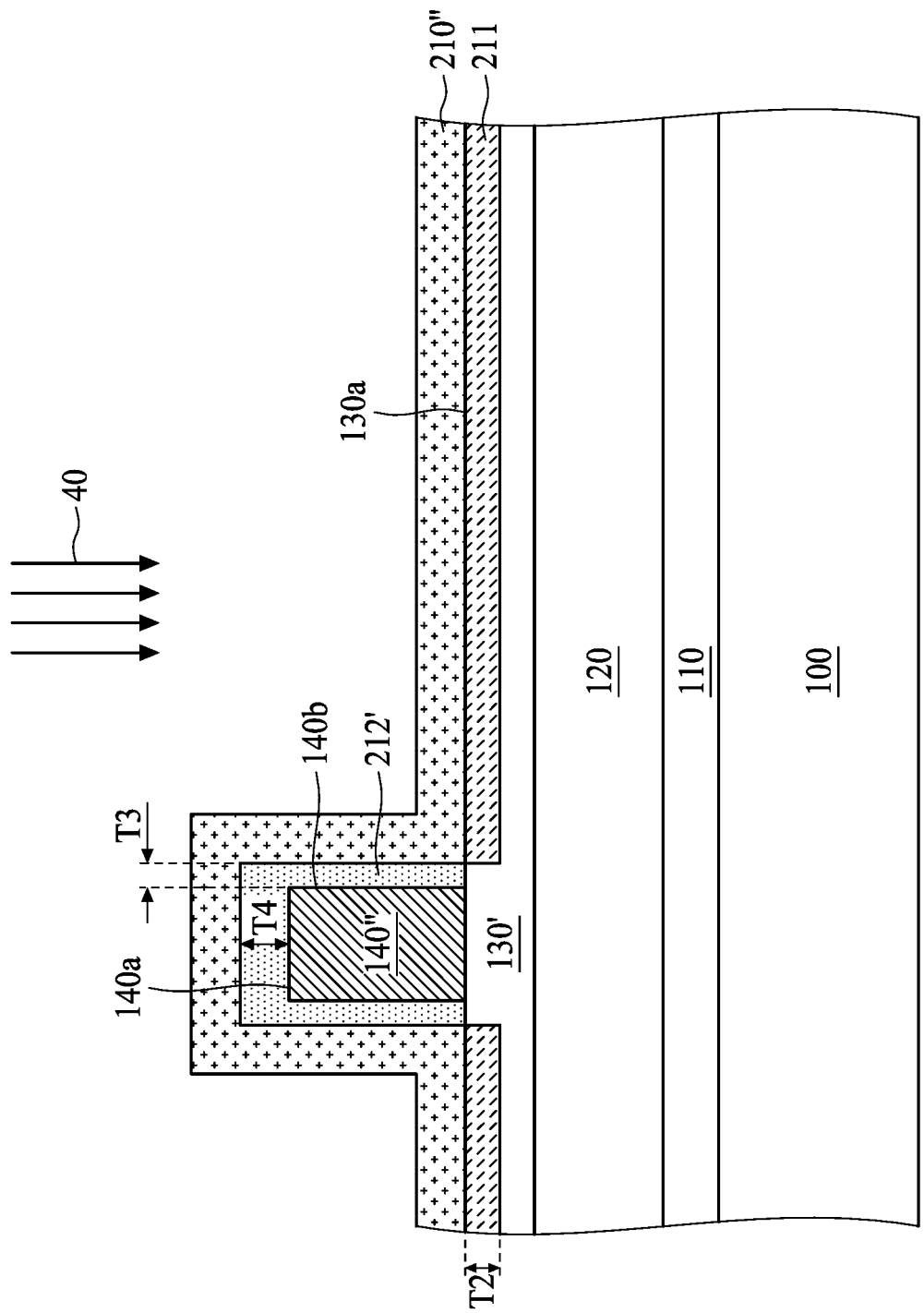

FIG. 9A and FIG. 9B illustrate various stages of a method for manufacturing a semiconductor device in accordance with some embodiments of the present disclosure.

As shown in FIG. 9A, a substrate 100 is provided. A buffer layer 110, a channel layer 120, a barrier layer 130 and a gate 140 are formed on the substrate 100. Next, a strained material 210' is deposited to conformally cover the surface 130a of the barrier layer 130 and the surfaces 140a and 140b of the gate 140.

As shown in FIG. 9B, heat treatment 40 is performed so that the strained material 210' may react with the barrier layer 130 and/or gate 140. The atoms of the strained material 210' diffuse into the barrier layer 130 through the surface 130a to form the portion 211. The atoms of the strained material 210' diffuse into the gate 140 through the surfaces 140a and 140b to form the portion 212'. In some embodiments, the heat treatment 40 includes RTA or other suitable process. As shown in FIG. 9B, the portion 211 is formed between the strained material 210" and the barrier layer 130'. The portion 212' is formed between the gate 140" and the strained material 210". As shown in FIG. 9B, the portion 212' conformally covers the surface of the gate 140".

In some embodiments, the portion of the strained material 210' that does not react with the barrier layer 130 and/or gate 140 may be removed by etching. That is, the strained material 210" may be removed. After the strained material 210" is removed, the source 150, drain 160, passivation layer 180, planarization layer 190 and field plate 200 are formed, thereby producing the semiconductor device 5 as shown in FIG. 5.

Figure 10A:
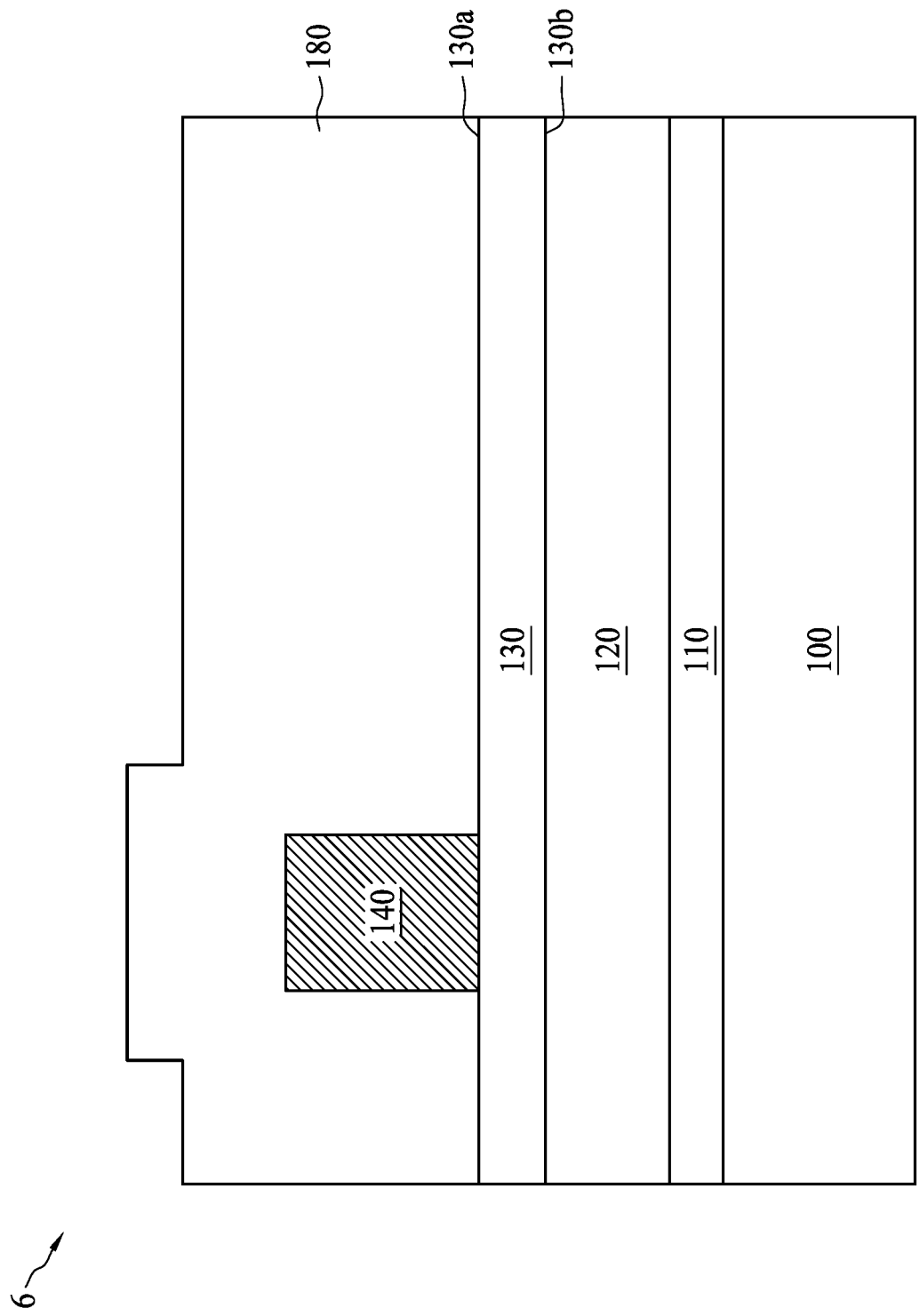
FIG. 10A illustrates one of the stages of a method for manufacturing a semiconductor device of a comparative example.

FIG. 10A is a cross-sectional view of one of the stages of a comparative example. As shown in FIG. 10A, the semiconductor device 6 does not include a strained layer. After the gate 140 is formed, the passivation layer 180 is formed to cover the gate 140 and the barrier layer 130.

Figure 10B:
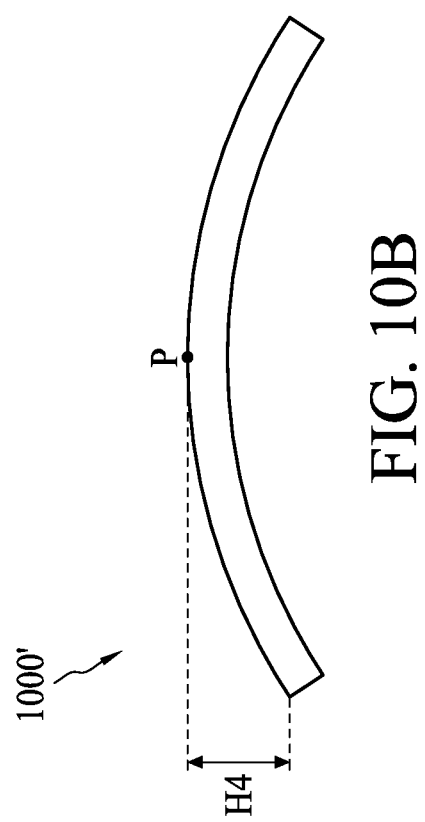
FIG. 10B is a side view of the entire structure of a comparative example.

FIG. 10B is a side view of the entire structure 1000' corresponding to the stage of FIG. 10A of the semiconductor device 6. As shown in FIG. 10B, after the passivation layer 180 directly covers the gate 140 and the barrier layer 130, there is a height difference H4 between the edge of the entire structure 1000' and reference point P. In some embodiments, H4 is greater than H3. That is, the angularity of the entire structure 1000' of FIG. 10B exceeds that of the entire structure 1000 of FIG. 7D. In a comparative example, no strained layer is formed to modify stress imposed on the entire structure 1000', increasing warpage of the entire structure 1000'.

Figure 11:
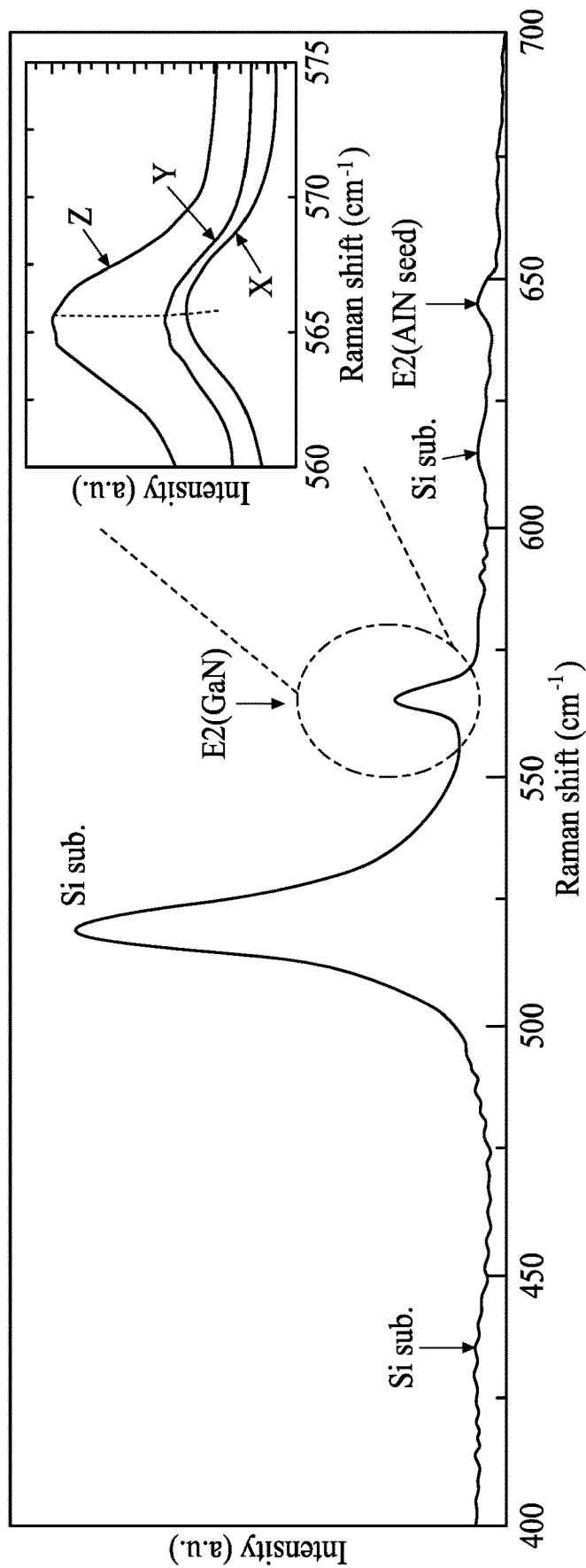
FIG. 11 is a Raman spectrum of a semiconductor device.

FIG. 11 is a Raman spectrum of a semiconductor device, for example, a GaN-on-Si HEMT, measured at 25° C. The horizontal axis refers to Raman shift, e.g., wavelength of a scattering light. The vertical axis refers to the intensity of a scattering light. As shown in FIG. 11, there are wave peak X at wavelength of 565.8 nm, wave peak Y at wavelength of 565.5 nm and wave peak Z at wavelength of 565.2 nm. X is a wave peak obtained from a comparative example without formation of a strained layer. Y is a wave peak obtained from a semiconductor device including a strained layer with a thickness of 1 nm. Z is a wave peak obtained from a semiconductor device including a strained layer with a thickness of 1.5 nm. The material of the strained layer is AlN.

The stress imposed on the channel can be determined from the intensities of wave peaks X, Y and Z, respectively. As shown in FIG. 11, the intensity of the scattering light of wave peak X is less than that of wave peaks Y and Z of which semiconductor device includes the strained layer. In addition, as the thickness of the strained layer increases, the wavelength of the wave peak decreases. Further, by calculating the intensity of wave peaks X, Y and Z, the stresses of three semiconductor devices can be obtained, which are 0.5 GPa, 0.58 GPa and 0.64 GPa, respectively. From above, as the thickness of the strained layer increases, the stress imposed on the channel layer increases, resulting in increase of the concentration of electron in 2DEG region.

According to some embodiments of the present disclosure, a strained layer is formed between the passivation layer and the barrier layer, which can modify the stress imposed on the channel layer and polarization. Therefore, the concentration of electron in 2DEG region is enhanced. In comparison with a comparative example that does not include a strained layer, the semiconductor device of the present disclosure has a less Rds-On. According to some embodiments of the present disclosure, the strained layer is patterned, which prevents from electric filed concentrating under the edge of the gate, resulting in leakage current. According to some embodiments of the present disclosure, the thickness of the strained layer is modified so that Rds-on can be optimized. As a result, Rds-on can much easily be tuned, thereby improving the reliability of the semiconductor device. According to some embodiments of the present disclosure, the strained layer is formed on the barrier layer, which can compensate the warpage of the entire structure during the formation of the semiconductor device. As a result, the process window is improved.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A high-electron-mobility transistor (HEMT), comprising:
   a substrate;
   a channel layer disposed on the substrate;
   a barrier layer disposed on the channel layer;
   a gate disposed on the barrier layer;
   a strained layer disposed on the barrier layer and having a plurality of through holes; and
   a passivation layer covering the gate and the strained layer,
   wherein a material of the passivation layer differs from a material of the strained layer, and portions of the passivation layer extend into the through holes of the strained layer respectively, such that each of the portions of the passivation layer contacts an inner side surface of the strain layer and a part of a top surface of the barrier layer.

2. The HEMT of claim 1, wherein the strained layer imposes a tensile stress on the channel layer.

3. The HEMT of claim 1, wherein the strained layer comprises a crystal structure.

4. The HEMT of claim 3, wherein a lattice constant of the strained layer ranges from about 3.0 Å to about 3.4 Å.

5. The HEMT of claim 3, wherein a thickness of the strained layer ranges from about 1 nm to about 100 nm.

6. The HEMT of claim 1, wherein the strained layer comprises an amorphous structure.

7. The HEMT of claim 6, wherein a thickness of the strained layer ranges from about 1 nm to about 100 nm.

8. The HEMT of claim 1, wherein the strained layer comprises a first portion covering the barrier layer.

9. The HEMT of claim 1, wherein the strained layer comprises a first portion covering the barrier layer and a second portion covering the gate.

10. The HEMT of claim 9, wherein a component of the first portion differs from a component of the second portion.

11. The HEMT of claim 9, wherein a thickness of the first portion differs from a thickness of the second portion.

12. The HEMT of claim 1, wherein the strained layer comprises an opening exposing the barrier layer.

13. A high-electron-mobility transistor (HEMT), comprising:
    a substrate;
    a channel layer disposed on the substrate;
    a barrier layer disposed on the channel layer;
    a gate disposed on the barrier layer;
    a strained layer disposed on the barrier layer and having a plurality of through holes; and
    a passivation layer covering the gate and the strained layer;
    wherein a material of the strained layer comprises at least one of silicon nitride, silicon oxide, silicon oxynitride, boron oxide, boron nitride, boron oxynitride, aluminum oxide, aluminum nitride, aluminum oxynitride, titanium oxide and titanium oxynitride, and portions of the passivation layer extend into the through holes of the strained layer respectively, such that each of the portions of the passivation layer contacts an inner side surface of the strain layer and a part of a top surface of the barrier layer.

14. The HEMT of claim 13, wherein a thickness of the strained layer ranges from about 1 nm to about 100 nm.

15. The HEMT of claim 13, wherein the strained layer conformally covers the gate.

16. The HEMT of claim 13, wherein the strained layer comprises a first portion covering the barrier layer and a second portion covering the gate.

17. The HEMT of claim 16, wherein a component of the first portion differs from a component of the second portion.

18. The HEMT of claim 16, wherein a thickness of the first portion differs from a thickness of the second portion.

19. The HEMT of claim 13, wherein the strained layer comprises an opening exposing the barrier layer.

20. A method for manufacturing a high-electron-mobility transistor (HEMT), comprising:
    providing a substrate;
    forming a channel layer on the substrate;
    forming a barrier layer on the channel layer;
    forming a gate on the barrier layer;
    forming a strained layer having a plurality of through holes on the barrier layer; and
    forming a passivation layer covering the gate and the strained layer, such that portions of the passivation layer extend into the through holes of the strained layer respectively, wherein each of the portions of the passivation layer contacts an inner side surface of the strain layer and a part of a top surface of the barrier layer, wherein a material of the passivation layer differs from a material of the strained layer.

* * * * *